(12) United States Patent
Rolfson et al.

(10) Patent No.: US 6,328,803 B2
(45) Date of Patent: *Dec. 11, 2001

(54) METHOD AND APPARATUS FOR CONTROLLING RATE OF PRESSURE CHANGE IN A VACUUM PROCESS CHAMBER

(75) Inventors: J. Brett Rolfson; Elton Hochhalter, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/805,018

(22) Filed: Feb. 21, 1997

(51) Int. Cl.[7] .................................................. C23C 16/00
(52) U.S. Cl. .............................. 118/715; 118/663; 118/50
(58) Field of Search ..................................... 118/715, 718, 118/758, 663, 665, 668; 156/345; 438/689

(56) References Cited

U.S. PATENT DOCUMENTS

| 4,640,221 | * | 2/1987 | Barber et al. ................ 118/715 |
| 4,680,474 | * | 7/1987 | Turner et al. . |
| 4,845,558 | | 7/1989 | Tsai et al. . |
| 5,032,734 | | 7/1991 | Orazio, Jr. et al. . |
| 5,062,446 | * | 11/1991 | Anderson . |
| 5,186,718 | * | 2/1993 | Tepman et al. . |
| 5,240,046 | * | 8/1993 | Mack . |
| 5,380,396 | * | 1/1995 | Shikida et al. ................. 118/728 |
| 5,575,855 | * | 11/1996 | Karai et al. .................... 118/718 |
| 5,645,642 | * | 7/1997 | Nishizato et al. . |

OTHER PUBLICATIONS

Wolf, S. and Tauber, R. N., Silicon Processing For The VLSI Era,, vol. 1: Process Technology, Lattice Press, 1986, pp. 162–172.

* cited by examiner

Primary Examiner—Deborah Jones
Assistant Examiner—Jennifer McNeil
(74) Attorney, Agent, or Firm—Stephen A. Gratton

(57) ABSTRACT

A method, apparatus and system for controlling a rate of pressure change in a vacuum process chamber during pump down and vent up cycles of a vacuum process are provided. The method includes sensing the pressure in the process chamber, and then controlling the rate of pressure change to achieve a desired rate for a particular vacuum process. For a pump down cycle, the apparatus can include a control valve in flow communication with the process chamber and with an evacuation pump. For a vent up cycle, the apparatus can include a control valve in flow communication with the process chamber and with an inert gas supply. With either embodiment controllers can be programmed to adjust positions of the control valves based upon feedback from pressure sensors. The system can include multiple chambers each having an associated pump down and vent up control apparatus configured to match the rates of pressure change between chambers.

23 Claims, 5 Drawing Sheets

METHOD AND APPARATUS FOR CONTROLLING RATE OF PRESSURE CHANGE IN A VACUUM PROCESS CHAMBER

FIELD OF THE INVENTION

This invention relates generally to vacuum processes, such as dry etching and chemical vapor deposition particularly for semiconductor manufacture. More specifically, this invention relates to a method and apparatus for controlling a rate of pressure change in a vacuum process chamber during pump down and vent up cycles of a vacuum process.

BACKGROUND OF THE INVENTION

Various etching and deposition processes for semiconductor manufacture are performed in vacuum process chambers. For example, dry etching and chemical vapor deposition (CVD) processes utilize vacuum process chambers. Conventional dry etching processes include plasma etching and reactive ion etching (RIE). Conventional chemical vapor deposition processes include plasma enhanced chemical vapor deposition (PECVD) and low pressure chemical vapor deposition (LPCVD).

During these processes the process chamber can be evacuated from an initial pressure to an operating pressure. For example, the process chamber may initially be at atmospheric pressure for loading wafers, then evacuated to an operational pressure in the milli-torr range. The initial evacuation cycle for a process is sometimes referred to as a "pump down cycle". Typically, a pump down cycle is accomplished using a vacuum pump in flow communication with the process chamber.

Subsequently, the pressure in the process chamber can be increased from the operating pressure back to the initial pressure (e.g., back to atmospheric pressure). The subsequent pressurization cycle is sometimes referred to as a "vent up cycle". Typically, a vent up cycle is accomplished by injecting an inert gas into the process chamber to a desired pressure.

Recently, etching and deposition systems having more than one vacuum process chamber have been employed for semiconductor manufacture. These multi-chamber systems improve production rates and provide increased efficiency over single chamber systems. An example of a multi-chambered etching or deposition system is sold under the trademark "APPLIED MATERIALS 5000", by Applied Materials, Inc., of Santa Clara, Calif.

Such a multi chambered system can include a wafer handler, a load lock chamber and multiple process chambers. The wafer handler can include cassettes for holding the wafers and cassette ports for loading the wafers. During an etching or deposition process, the wafers can be moved from the load lock chamber and into or out of the process chambers as required. The process chambers can be pumped down and vented up to different pressures during various cycles of the process.

One limitation of multi chamber systems is that wafer defects can sometimes occur more frequently in a particular process chamber relative to the other process chambers. For example, some types of wafer defects can be detected using optical detectors such as those manufactured by KLA Instruments Corporation, Santa Clara, Calif. These types of defects are sometimes termed "KLA defects". The inventors have observed variations in KLA defects among wafers processed in different process chambers of multi chamber vacuum systems. In particular, some process chambers in multi chamber systems produce wafers with more defects.

One possible source of defect variation between the process chambers is that the rate of pressure change for the chambers during pump down and vent up cycles may not be the same. This difference in rate of pressure change can cause the pressures in the process chambers to be different for significant time increments. The pressure rate differences may be due to variations between conduction lines, pumps, valves and associated equipment for the different chambers. These variations can be caused by residue build up and other factors.

The same situation can occur among different single chamber systems adapted to perform the same process. Specifically, variations can occur between the different process chambers causing differences in the wafers. In this situation it would be advantageous to control the rate of pressure change during pump down and vent up in the process chambers in order to achieve process uniformity.

Prior art attempts to regulate pump down cycles in vacuum process chambers include "soft-start" valves, which open at a linear rate (i.e., at a certain percentage per second). Prior art attempts to regulate vent up cycles in vacuum process chambers include needle valves and mass flow controllers which control the flow rate into a particular chamber during vent up. However, these prior art systems do not compensate for system variables and are inherently linear in response. Accordingly, significant pressure differentials can still occur between different process chambers causing differences in the semiconductor wafers being processed.

The present invention provides a method and apparatus for achieving an optimal rate of pressure change in a vacuum process chamber during pump down and vent up cycles of a vacuum process. For multi chamber vacuum systems, the rate of pressure change between different process chambers can be matched such that one process variable can be eliminated and wafer uniformity can be improved. Similarly, for multiple single chamber systems adapted to perform the same process, one process variable can be eliminated and the uniformity of the wafers produced by the different vacuum process chambers can be improved.

SUMMARY OF THE INVENTION

In accordance with the present invention, a method and apparatus for controlling the rate of pressure change in a process chamber during pump down and vent up cycles of a vacuum process are provided. The method, simply stated, comprises, determining a desired rate of pressure change for the process chamber, and then, controlling the gas flow out of, or into, the process chamber to achieve the desired rate of pressure change. The gas flow can be controlled using a flow control valve and programmed controller responsive to feed back from pressure sensors within the process chamber. The desired rate of pressure change can be determined empirically for a particular vacuum process, expressed mathematically, and then programmed into the controller.

An apparatus constructed in accordance with the invention, comprises: a pressure sensor for sensing pressure in the process chamber; a control valve in flow communication with the process chamber; and a programmed controller for controlling the control valve responsive to the pressure sensor. Separate controllers and control valves can be operably associated with the process chamber for the pump down and vent up cycles of a vacuum process. For controlling the pump down cycle, a control valve can be in flow communication with a vacuum pump. For controlling the vent up cycle, a control valve can be in flow communication with an inert gas supply.

A system constructed in accordance with the invention comprises multiple process chambers configured for a vacuum process such as depositing or etching layers of semiconductor wafers. The multiple process chamber can be contained on the same frame or can be contained on separate pieces of equipment configured to perform the same process. Each process chamber includes a pressure sensor, and separate control valves and controllers for controlling pump down and vent up cycles during the vacuum processes. The controllers and control valves can be configured to match the rates of pressure change in the process chambers during the pump down and vent up cycles. The matched rates permit more process uniformity between the process chambers so that excessive defects do not occur in any one process chamber.

DETAILED DESCRIPTION OF THE PREFERRED EMBODIMENTS

Figure 1A:
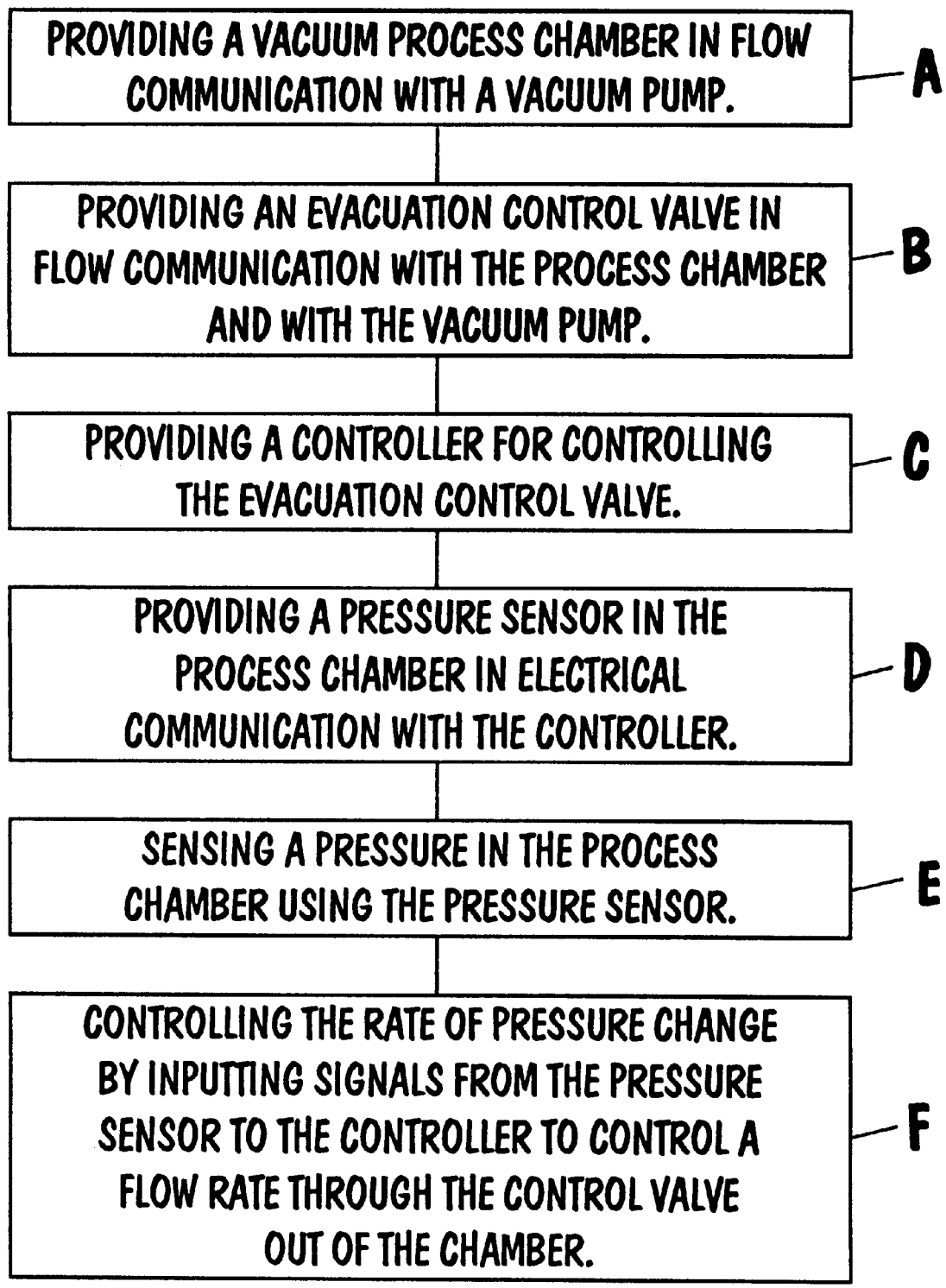
FIG. 1A is a flow diagram of a method for controlling a rate of pressure change in a vacuum process chamber during a pump down cycle of a vacuum process.

Referring to FIG. 1A, broad steps in a method for controlling the rate of pressure change in a vacuum process chamber during a pump down cycle of an etching or deposition process are shown. For a pump down cycle the method includes the steps of:

A. Providing a vacuum process chamber in flow communication with a vacuum pump.

B. Providing an evacuation control valve in flow communication with the process chamber and with the vacuum pump.

C. Providing a controller for controlling the evacuation control valve.

D. Providing a pressure sensor in the process chamber in electrical communication with the controller.

E. Sensing a pressure in the process chamber using the pressure sensor.

F. Controlling the rate of pressure change by inputting signals from the pressure sensor to the controller to control a flow rate through the control valve out of the chamber.

Figure 1B:
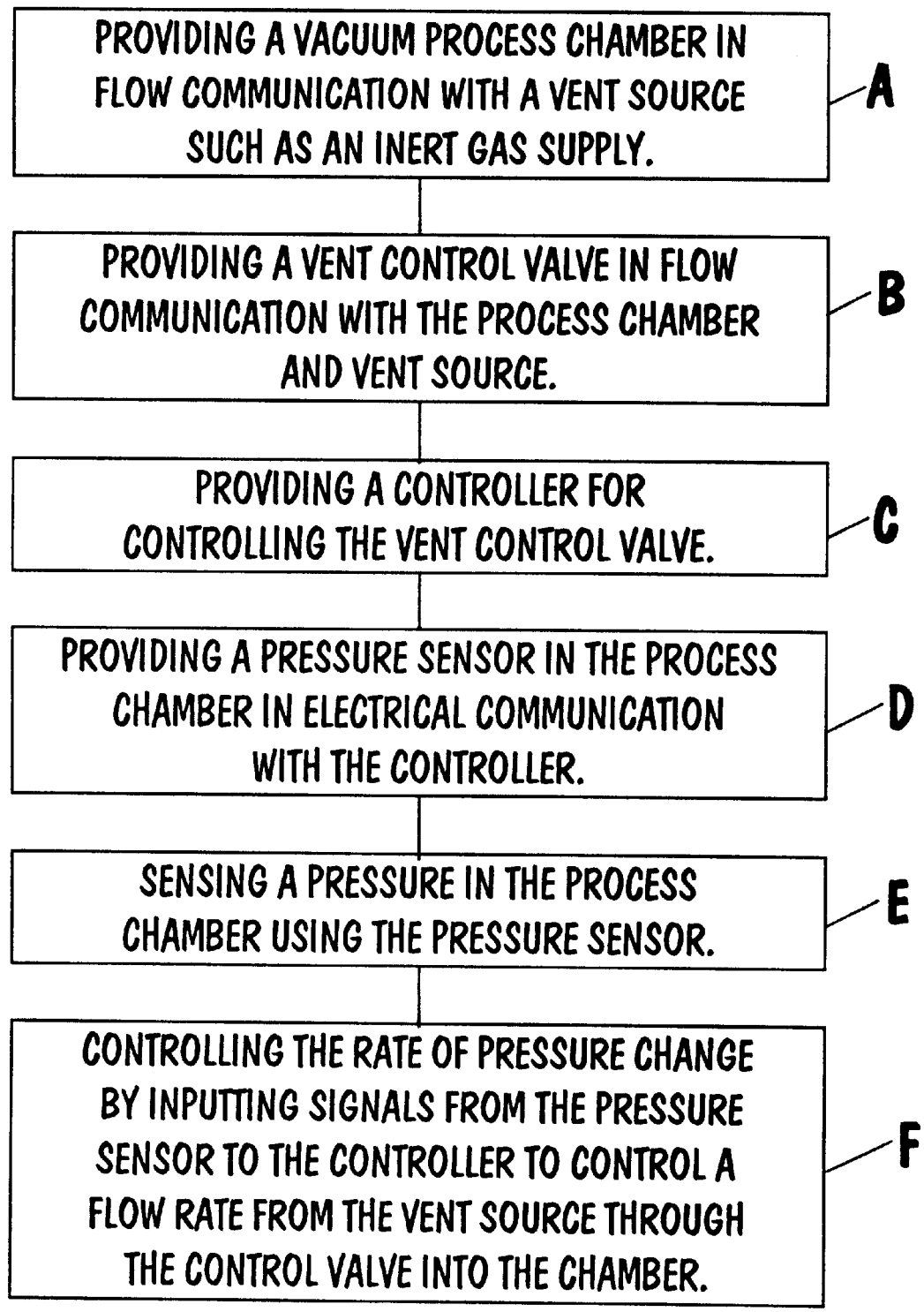
FIG. 1B is a flow diagram of a method for controlling a rate of pressure change in a vacuum process chamber during a vent up cycle of a vacuum process.

Referring to FIG. 1B, broad steps in a method for controlling the rate of pressure change in a vacuum process chamber during a vent up cycle are shown. For a vent up cycle the method includes the steps of:

A. Providing a vacuum process chamber in flow communication with a vent source such as an inert gas supply.

B. Providing a vent control valve in flow communication with the process chamber and vent source.

C. Providing a controller for controlling the vent control valve.

D. Providing a pressure sensor in the process chamber in electrical communication with the controller.

E. Sensing a pressure in the process chamber using the pressure sensor.

F. Controlling the rate of pressure change by inputting signals from the pressure sensor to the controller to control a flow rate from the vent source through the control valve into the chamber.

Figure 2A:
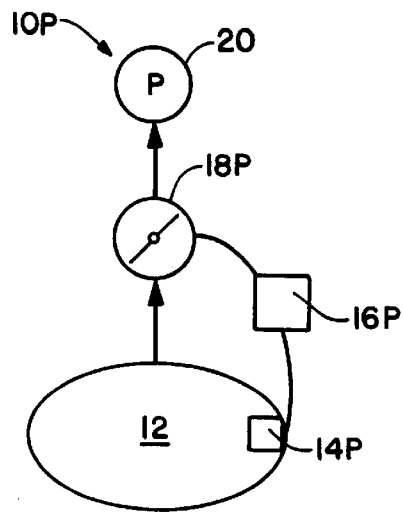
FIG. 2A is a schematic diagram of an apparatus constructed in accordance with the invention for controlling the rate of pressure change in a vacuum process chamber during a pump down cycle of a vacuum processes.

Referring to FIG. 2A, a pump down apparatus 10P for controlling a rate of pressure change in a vacuum process chamber 12 during a pump down cycle is illustrated. The pump down apparatus 10P includes a pressure sensor 14P configured to sense a pressure within the process chamber; a controller 16P in electrical communication with the pressure sensor 14P configured to receive feedback from the pressure sensor 14P; and a pump down control valve 18P coupled to the controller 16P in flow communication with the process chamber 12.

The vacuum process chamber 12 can be a component of an etching system such as a plasma etcher or a reactive ion etcher (RIE). Alternately the vacuum process chamber 12 can be a component of a CVD deposition system such as a plasma enhanced chemical vapor deposition (PECVD) apparatus, or a low pressure chemical vapor deposition (LPCVD) reactor.

The vacuum process chamber 12 is adapted to contain a gaseous etching or deposition species. The vacuum process chamber 12 is in flow communication with an evacuation pump 20. The evacuation pump 20 is configured to pump down (i.e., evacuate) and then to maintain the process chamber 12 at a desired vacuum pressure. For vacuum etching or deposition processes, the vacuum process chamber 12 can be evacuated to pressures of from 760 torr to $10^{-8}$ torr or less. Suitable conduits, such as tubes or pipes, can be formed between the vacuum process chamber 12 and the evacuation pump 20 to form conduction lines for the etching or deposition gases.

The pump down control valve 18P is located in the flow path of the etching or deposition gases from the process chamber 12 to the evacuation pump 20. The pump down control valve 18P is configured to regulate a flow rate of gases from the vacuum process chamber 12 to the evacuation pump 20 during a pump down cycle. The pump down control valve 18P can be a standard flow control valve such as a throttle valve or butterfly valve that is responsive to electrical signals from the controller 16P.

The controller 16P is configured to receive electrical signals from the pressure sensor 14P. This provides real time feed back to the controller 16P of the pressure within the process chamber 12. In addition, the controller 16P is configured to input electrical signals into the pump down control valve 18P for adjusting the pump down control valve 18P to achieve a desired flow rate at a particular pressure.

The controller 16P can include a microprocessor and programmable memory that is programmable to achieve a desired mode of operation for the controller 16P. For example, the controller 16P can be programmed such that the pump down control valve 18P achieves a desired rate of pressure change in the process chamber 12 during the pump down cycle. The controller 16P can also include a calibration cycle wherein the rate of pressure change at a given pressure versus a valve position for the control valve 18P at that pressure is determined. The calibration step is optional but makes the response of the control valve 18P more rapid and accurate.

As will be further explained, the desired rate of pressure change can be an empirically determined optimal rate. In addition, for multiple chamber systems, the desired rate of pressure change can be matched to the rate in another chamber. The multiple chambers can be included in the same system, or frame, or can be included in separate systems adapted to perform the same process.

Figure 4:
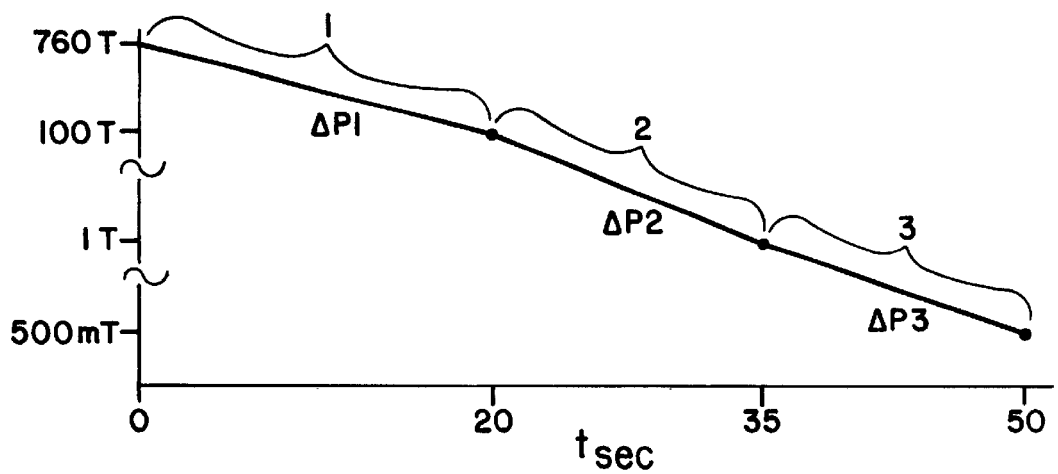
FIG. 4 is a graph of pressure vs. time in a process chamber during a pump down cycle illustrating a rate of pressure change comprising a series of linear segments.
Figure 5:
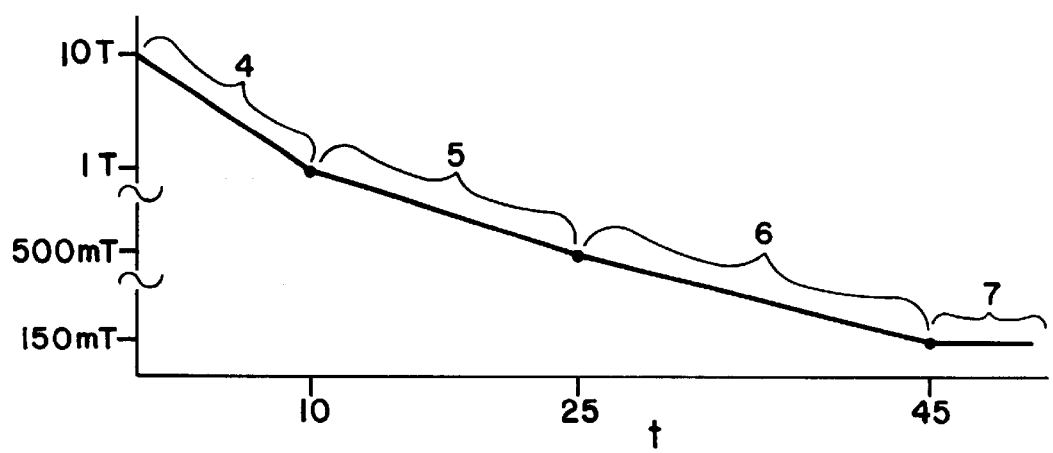
FIG. 5 is a graph of pressure vs. time in a process chamber during a pump down cycle illustrating another rate of pressure change comprising a series of linear segments.
Figure 6:
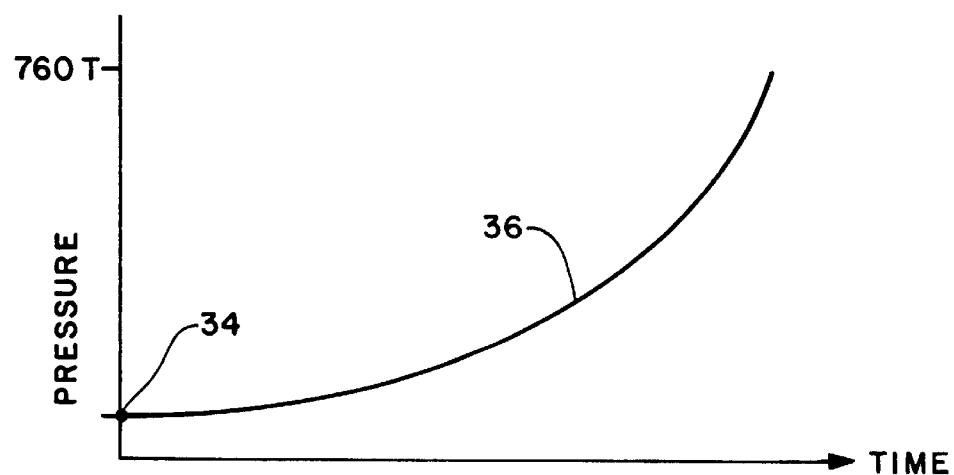
FIG. 6 is a graph of pressure vs. time in a process chamber during a vent up cycle illustrating a rate of pressure change comprising an exponential curve.

Preferably, the desired rate of pressure change can be expressed mathematically such as illustrated in FIGS. 4–6. In these figures, pressure is plotted as a function of time and the rate of pressure change $\Delta P$ comprises the slope of the resultant curve.

Figure 2B:
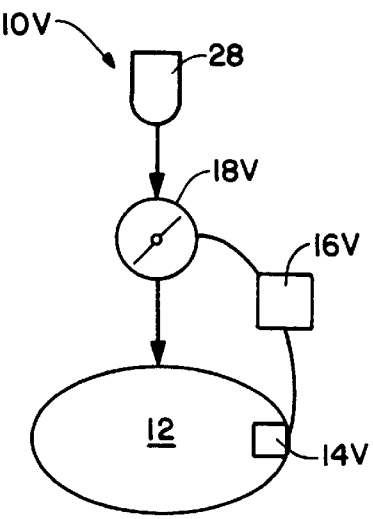
FIG. 2B is a schematic diagram of an apparatus constructed in accordance with the invention for controlling the rate of pressure change in a vacuum process chamber during a vent up cycle of a vacuum process.

Referring to FIG. 2B, a vent up apparatus 10V for controlling a rate of pressure change in the process chamber 12 during a vent up cycle of a vacuum process is shown. During the vent up cycle the pressure within the process chamber 12 can be increased to a level that is higher than the operating pressure for a particular vacuum process. This increased pressure level can be atmospheric pressure, or can be an intermediate pressure level, such as the vacuum pressure of a load lock chamber for the process chamber 12.

The vent up apparatus 10V comprises a pressure sensor 14V configured to sense a pressure within the process chamber; a controller 16V in electrical communication with the pressure sensor 14V configured to receive feedback from the pressure sensor 14V; and a vent up flow control valve 18V coupled to the controller 16V in flow communication with the process chamber 12.

In the vent up apparatus 10V, the vacuum process chamber 12 is in flow communication with an inert gas supply 28. The inert gas supply 28 can be maintained at a higher pressure than the operating pressure of the process chamber 12. The inert gas supply 28 is configured to inject an inert gas into the process chamber 12 during the vent up cycle. The vent up control valve 18V is configured to regulate a flow rate of gas from the inert gas supply 28 to the vacuum process chamber 12 during the vent up cycle. The controller 16V can be constructed as previously described for controller 16P and can include a microprocessor and programmable memory. Feed back from the pressure sensor 14V to the controller 16V enables the controller 16V to adjust the positions of the vent up control valve 18V to achieve a desired gas flow and rate of pressure change during the vent up cycle. Again this desired rate of pressure change can be empirically determined and can be matched in a multi chamber system. In addition, the controller 16V can include a periodic calibration cycle to determine the rate of pressure change at a given pressure and valve position.

Figure 2C:
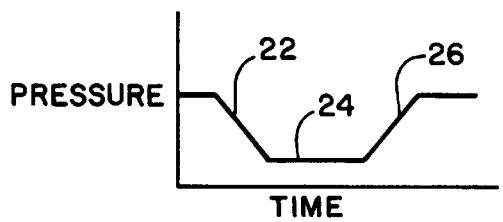
FIG. 2C is a graph illustrating the pressure within the vacuum process chamber as a function of time during pump down, operational and vent up cycles of a vacuum process.

FIG. 2C illustrates the pressure in the process chamber 12 as a function of time during an etching or deposition process. During the pump down cycle, the pressure in the process chamber 12 is decreased as indicated by the pump down portion 22 of the pressure curve. The rate of pressure change ($\Delta P$) during the pump down cycle (i.e., slope of portion 22) is controlled by the controller 16P (FIG. 2A) and the pump down control valve 18P (FIG. 2A). During the operating cycle, the pressure in the process chamber 12 is maintained at a desired operating pressure as indicated by the operating portion 24 of the pressure curve. During the vent up cycle, the pressure in the process chamber 12 is increased as indicated by the vent up portion 26 of the pressure curve. During the vent up cycle, the rate of pressure change ($\Delta P$) is controlled by the controller 16V (FIG. 2B) and vent up control valve 18V.

Figure 3A:
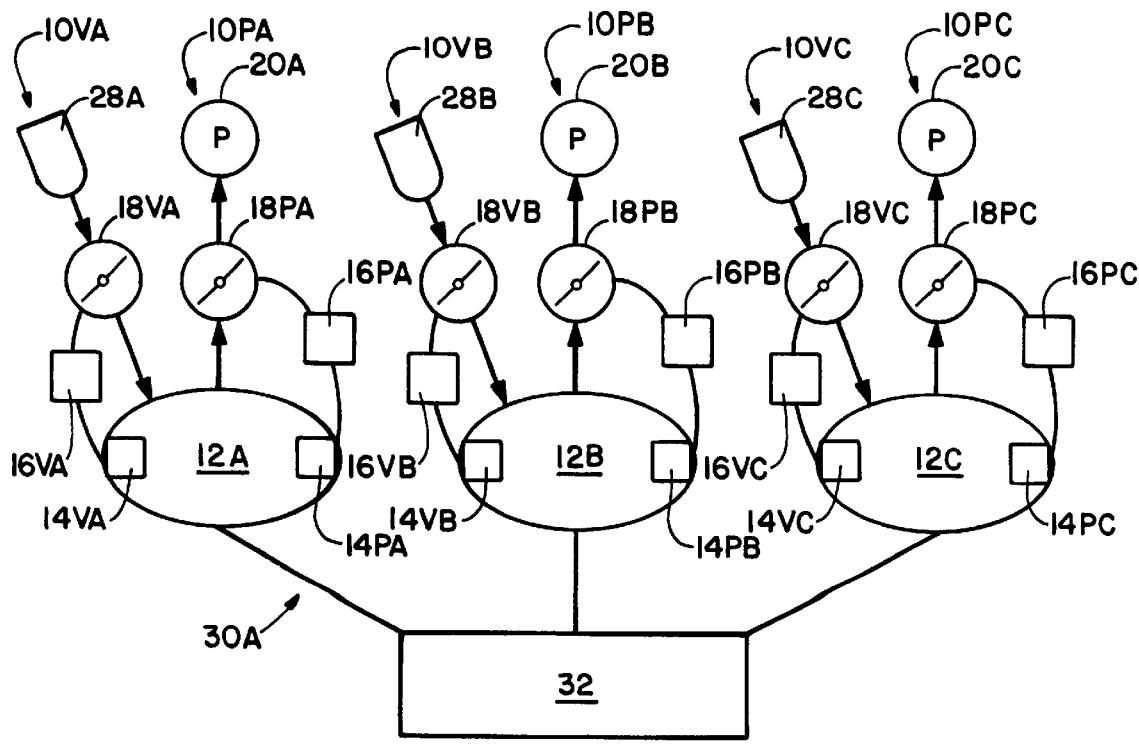
FIG. 3A is a schematic diagram of a multi chambered system constructed in accordance with the invention with multiple process chambers contained on a same frame, wherein the rate of pressure change in the different process chambers during pump down and vent up can be matched.

Referring to FIG. 3A, a multi chamber system 30A constructed in accordance with the invention with multiple chambers on a same frame is shown. As used herein, the term "same frame" refers to a single piece of equipment. For example, the system 30A can be based on a commercially available multi chamber frame, such as an "APPLIED MATERIALS 5000" manufactured by Applied Materials, Inc. of Santa Clara, Calif.

The system 30A can be configured for etching or depositing layers on semiconductor wafers during semiconductor fabrication processes. The system 30A includes a first process chamber 12A, a second process chamber 12B, and a third process chamber 12C. The system 30A can also include a wafer handler 32 configured to transport semiconductor wafers loaded in cassettes from a load lock station into the process chambers 12A–12C for etching or deposition processes.

Each process chamber 12A–12C includes an associated pump down apparatus 10PA–10PC. Each pump down apparatus 10PA–10PC includes a pump down pressure sensor 14PA–14PC, a pump down controller 16PA–16PC, a pump down control valve 18PA–18PC, and an evacuation pump 20A–20C. These elements function the same as the equivalent elements previously described. In the multi chamber system 30A, the rate of pressure change in the different process chambers 12A–12C during the pump down cycle can be an optimal rate as previously described. In addition, the rate of pressure change ($\Delta P$) can be substantially the same (i.e., matched) for each process chamber 12A–12C.

Each process chamber 12A–12C also includes an associated vent up apparatus 10VA–10VC. Each vent up apparatus 10VA–10VC includes a vent up pressure sensor 14VA–14VC, a vent up controller 16VA–16VC, a vent up control valve 18VA–18VC, and an inert gas supply 28A–28C. These elements function the same as the equivalent elements previously described. In the multi chamber system 30A, the rate of pressure change ($\Delta P$) in the different process chambers 12A–12C during the vent up cycle can be an optimal rate as previously described. In addition, the rate of pressure change can be substantially the same (i.e., matched) for each process chamber 12A–12C.

Figure 3B:
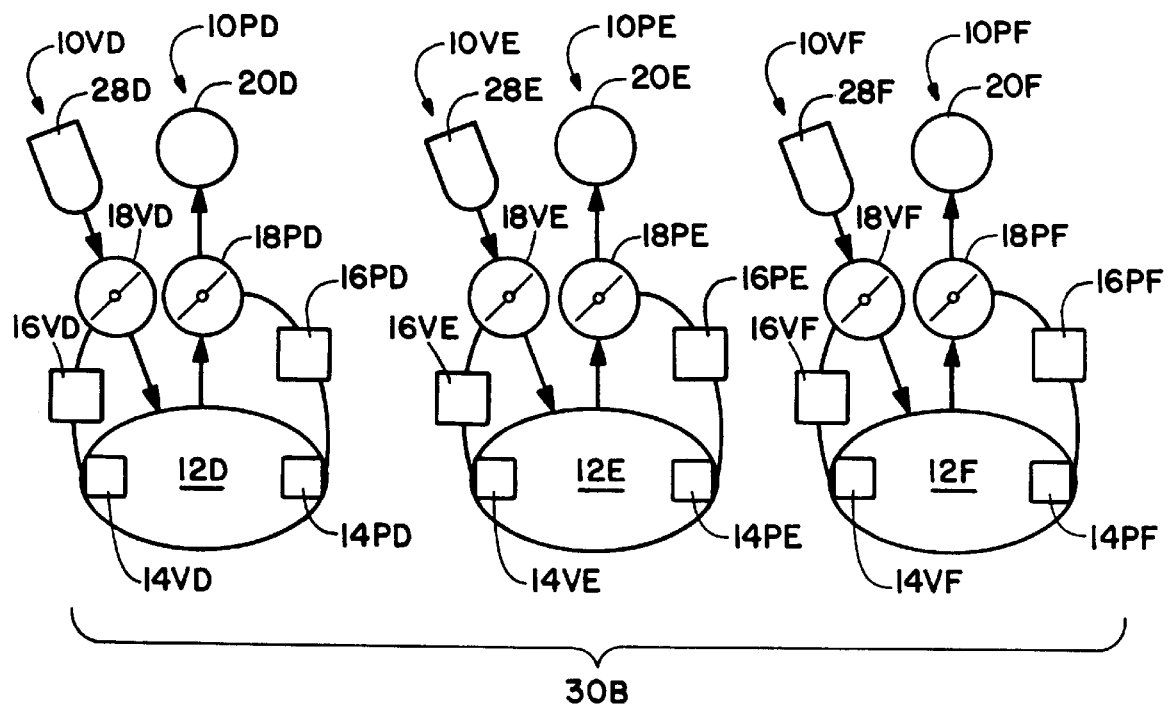
FIG. 3B is a schematic diagram of a multi chambered system constructed in accordance with the invention with multiple process chambers on separate pieces of equipment but configured to perform the same process, wherein the rate of pressure change in the different process chambers during pump down and vent up can be matched.

Referring to FIG. 3B, a system 30B includes separate process chambers 12D–12F that are not contained on the same frame. For example, the process chambers 12D–12F can be similar pieces of equipment that are not clustered together, but which perform the same processes (e.g., polysilicon deposition, metal etching, silicon nitride deposition and etching etc.). Since these process chambers 12D–12F may be in different areas of the semiconductor manufacturing plant, process variables can occur between the process chambers 12D–12F. For example, these process variables can include differences in pumping speeds, conduction line resistance, preventative maintenance schedules as well as others.

In accordance with the invention, each process chamber includes an associated vent up apparatus 10VD–10VF. Each vent up apparatus 10VD–10VF includes a vent up pressure sensor 14VD–14VF, a vent up controller 16VD–16VF, a vent up control valve 18VD–18VF, and an inert gas supply 28D–28F. These elements function the same as the equivalent elements previously described. In the multi chamber system 30B the rate of pressure change (ΔP) in the different process chambers 12D–12F during the vent up cycle can be an optimal rate as previously described. In addition, the rate of pressure change can be substantially the same (i.e., matched) for each process chamber 12D–12F.

As also shown in FIG. 3B, each process chamber 12D–12F includes an associated pump down apparatus 10PD–10PF. Each pump down apparatus 10PD–10PF includes a pump down pressure sensor 14PD–14PF, a pump down controller 16PD–16PF, a pump down control valve 18PD–18PF, and an evacuation pump 20D–20F. These elements function the same as the equivalent elements previously described. In the multi chamber system 30B, the rate of pressure change in the different process chambers 12D–12F during the pump down cycle can be an optimal rate as previously described. In addition, the rate of pressure change (ΔP) can be substantially the same value (i.e., matched) for each process chamber 12D–12F.

In the multi chamber system 30B shown in FIG. 3B, each of the process chambers 12D–12F can be configured to perform the same process or "recipe". In addition, the vent up and pump down cycles for each recipe can be matched. Still further, the process chambers 12D–12F can comprise stock equipment from different equipment vendors but still use the same pump down and vent up cycles for a given process recipe.

EXAMPLE 1

Referring to FIG. 4, an exemplary pump down cycle for the pump down apparatus 10P (FIG. 2) is shown. In FIG. 4, the pressure in the process chamber 12 (FIG. 2) is plotted as a function of time as the pump down cycle progresses. Initially, the process chamber 12 (FIG. 2) has a pressure of approximately 760 torr. An optimal rate of pressure drop during the pump down cycle includes three (pressure v time) segments.

In a first segment the pressure is to be reduced to 100 torr in 20 seconds. In a second segment the pressure is to be reduced from 100 torr to 1 torr in 15 seconds. In a third segment the pressure is to be reduced from 1 torr to 500 milli-torr in 15 seconds. The rate of pressure change during each segment is represented by ΔP1, ΔP2 and ΔP3. Each rate of pressure change for a respective segment is linear for that segment. In other words, the change in pressure for each segment is directly proportional to the change in time. However, the rate of change ΔP1, ΔP2 and ΔP3 is different for each segment.

The (pressure vs. time) segments can be empirically determined and then programmed into the controller 16P (FIG. 2A). During each pressure segment the controller 16P (FIG. 2A) based upon input from the pressure sensor 14P (FIG. 2A) adjusts the position of the pump down control valve 18P (FIG. 2) to meet the desired rate of pressure change.

EXAMPLE 2

Referring to FIG. 5, another example of a pump down cycle is illustrated. In this example the process chamber 12 (FIG. 2A) is adjacent to a staging area, such as a load lock, wherein transfer of the wafers into the process chamber 12 (FIG. 2A) takes place. The staging area is at a pressure that is less than atmosphere, which in this example is 10 torr. On the other hand, the desired steady state processing pressure in the process chamber (FIG. 2A) is to be 150 milli-torr.

It is desired to pump down in a linear fashion from 10 torr to 1 torr in ten seconds, then from 1 torr to 500 milli-torr in 15 seconds, then from 500 milli-torr to the operating pressure of 150 milli torr in 20 seconds. These rates of pressure change are represented by segments 4, 5 and 6 respectively. Segment 7 represents the steady state operating pressure.

Based upon these predetermined rates of pressure change, the controller 16P (FIG. 2A) can be programmed to adjust the positions of the pump down control valve 18P (FIG. 2A) responsive to input from the pressure sensor 14P (FIG. 2A) to achieve the desired rate. Prior to the pump down cycle, a calibration cycle can be performed to determine the rate of pressure drop at a given pressure for different positions of the control valve 18P.

EXAMPLE 3

Referring to FIG. 6, an exemplary vent up cycle is illustrated. During the vent up cycle the pressure in the process chamber 12 (FIG. 2B) is increased from a steady state operating pressure 34 to atmospheric pressure. In this case it is desired to increase the pressure in the process chamber 12 (FIG. 2B) in a non linear or exponential manner. An exponential curve 36 represents the desired rate of pressure change during the vent up cycle. The exponential curve 36 can be empirically determined.

In accordance with the invention, the vent up controller 16V (FIG. 2B) is programmed to achieve a rate of pressure change in the process chamber 12 (FIG. 2B) that is equivalent to the exponential curve 36. Accordingly, the vent up controller 16V (FIG. 2B) based upon feedback from the pressure sensor 14V, (FIG. 2B) adjusts the positions of the vent up control valve 18V (FIG. 2B). The vent up control valve 18V meters the flow of inert gas from the inert gas supply 28 (FIG. 2B) to achieve the desired rate of pressure change.

Thus the invention provides an improved method, apparatus and system for controlling the rate of pressure change in a vacuum process chamber during pump down and vent up cycles of a vacuum etching or deposition process. In addition, the invention permits an optimal rate of pressure change to be achieved in a single chamber or multi chamber etching or deposition system. For a multi chamber system the rate of pressure change between different chambers of the system can be made substantially the same. This improves process uniformity because at least one variable is eliminated, and permits semiconductor wafers to be fabricated with fewer defects.

While the invention has been described with reference to certain preferred embodiments, as will be apparent to those skilled in the art, certain changes and modifications can be made without departing from the scope of the invention as defined by the following claims.

What is claimed is:

1. A method for controlling a vacuum process for semiconductor wafers comprising:
   providing a plurality of vacuum process chambers configured to perform the vacuum process, the chambers comprising pressure sensors configured to detect vacuum pressures in the chambers, valves in flow communication with the chambers configured to adjust the vacuum pressures, and controllers in signal communication with the pressure sensors configured to control the valves;
   determining defects on selected wafers processed in the chambers using the vacuum process;
   determining an optimal rate of pressure change in the chambers for reducing the defects during the vacuum process;
   placing the wafers in the chambers and performing the vacuum process;
   sensing the vacuum pressures in the chambers during the vacuum process using the pressure sensors; and
   controlling the vacuum pressures to reduce the defects by maintaining the optimal rate of pressure change in the chambers during a pump down cycle and a vent up cycle of the vacuum process using the valves and the controllers.

2. The method of claim 1 wherein the chambers are located at different areas of a semiconductor manufacturing plant.

3. The method of claim 1 wherein the vacuum process comprises a vacuum deposition process or a vacuum etching process.

4. A method for controlling a vacuum process for a semiconductor wafer comprising:
   providing a vacuum process chamber configured to perform the vacuum process;
   determining an optimal rate of pressure change for reducing defects on the wafer during the vacuum process by detecting defects on a plurality of semiconductor wafers processed in different vacuum process chambers using the vacuum process;
   expressing the optimal rate as a mathematical formula;
   providing a valve in flow communication with the chamber;
   providing a controller in signal communication with the valve and programmed with the mathematical formula;
   placing the wafer in the chamber and performing the vacuum process; and
   controlling a flow through the valve to the chamber during the vacuum process by sensing a pressure in the chamber, transmitting the pressure to the controller, and adjusting a position of the valve responsive to the controller to achieve the optimal rate of pressure change during a pump down cycle and a vent up cycle of the vacuum process.

5. The method of claim 4 wherein the pump down cycle is performed using a vacuum pump and the vent up cycle is performed using an inert gas.

6. The method of claim 5 wherein the vacuum process comprises a vacuum etching process or a vacuum deposition process.

7. A method for controlling a vacuum process for a semiconductor wafer comprising:
   providing a vacuum process chamber configured to perform the vacuum process;
   providing a pressure sensor in the chamber configured to sense a pressure in the chamber;
   providing a pump down valve in flow communication with the chamber and with a vacuum pump, and a vent up valve in flow communication with the chamber and with a supply of an inert gas;
   providing a programmable controller in signal communication with the pressure sensor configured to adjust a flow rate through the pump down valve and the vent up valve responsive to signals from the pressure sensor;
   determining an optimal rate of pressure change in the chamber for reducing defects on the wafer during the vacuum process by processing a plurality of semiconductor wafers using the vacuum process in a plurality of different process chambers with different rates of pressure change, then measuring the defects and then expressing the optimal rate as a mathematical formula;
   programming the controller with the formula;
   placing the wafer in the chamber and performing the vacuum process;
   sensing a pressure in the chamber during the vacuum process and communicating the pressure to the controller; and
   controlling the flow rate through the pump down valve and the vent up valve such that the rate of pressure change in the chamber during the vacuum process matches the optimal rate programmed into the controller.

8. The method of claim 7 wherein the vacuum process comprises a vacuum etching process.

9. The method of claim 7 wherein the vacuum process comprises a vacuum deposition process.

10. A method for controlling a vacuum process for semiconductor wafers comprising:
    providing a plurality of vacuum process chambers;
    providing a plurality of valves in flow communication with the chambers;
    providing at least one controller for the valves configured to control flow rates through the valves;
    providing a plurality of pressure sensors in the chambers in electrical communication with the controller configured to sense pressures in the chambers;
    determining an optimal rate of pressure change in the chambers for reducing defects on the wafers during the vacuum process by processing a plurality of semiconductor wafers using the vacuum process in a plurality of different process chambers with different rates of pressure change and then measuring the defects;
    placing the wafers in the chambers and performing the vacuum process; and
    matching rates of pressure change in the chambers to the optimal rate during a pump down cycle and a vent up cycle of the vacuum process by controlling the flow rates through the valves using the controller and the pressure sensors.

11. The method of claim 10 further comprising providing the controller with a mathematical formula representative of the optimal rate.

12. The method of claim 10 wherein the vacuum process comprises a vacuum etching process or a vacuum deposition process.

13. A vacuum system for semiconductor wafers comprising:
    a first process chamber and a second process chamber configured to perform a vacuum process on the wafers but located at different areas of a semiconductor manufacturing plant;

a first pressure sensor in the first process chamber and a second pressure sensor in the second process chamber; and a controller coupled to the first pressure sensor and to the second pressure sensor configured to control flow rates from the first chamber and the second chamber such that a rate of pressure change in the first chamber and the second chamber during a pump down cycle and during a vent up cycle of the vacuum process matches an optimal rate of pressure change selected to reduce defects in the wafers.

14. The system of claim 13 further comprising a first vacuum pump in flow communication with the first process chamber and a second vacuum pump in flow communication with the second process chamber.

15. A vacuum system for semiconductor wafers comprising:

a frame;

a first process chamber on the frame and a second process chamber on the frame configured to perform a vacuum process on a plurality of semiconductor wafers;

a first pressure sensor in the first process chamber and a second pressure sensor in the second process chamber;

a first control valve in flow communication with the first process chamber and a second control valve in flow communication with the second process chamber; and a controller coupled to the first control valve and to the first pressure sensor, and coupled to the second control valve and to the second pressure sensor, the controller responsive to the first pressure sensor and to the second pressure sensor to match a rate of pressure change in the first chamber and in the second chamber during a pump down cycle and a vent up cycle of the vacuum process to an optimal rate of pressure change selected to reduce defects in the wafers during the vacuum process.

16. The system of claim 15 wherein the controller is programmed with a mathematical formula representing the optimal rate of pressure change.

17. The system of claim 15 further comprising a first vacuum pump in flow communication with the first vacuum chamber and a second vacuum pump in flow communication with the second vacuum chamber.

18. The system of claim 15 wherein the vacuum process comprises a vacuum deposition process or a vacuum etching process.

19. A vacuum system for semiconductor wafers comprising:

a first process chamber and a second process chamber configured to perform a vacuum process on the wafers;

a first pressure sensor for sensing a first pressure in the first process chamber and a second pressure sensor for sensing a second pressure in the second process chamber;

a first control valve for controlling a first flow rate to or from the first process chamber and a second control valve for controlling a second flow rate to or from the second process chamber;

at least one controller responsive to the first pressure sensor for controlling the first control valve and responsive to the second pressure sensor for controlling the second control valve, the controller programmed with an optimal rate of pressure change which is empirically determined by measuring defects on a plurality of different wafers processed with the vacuum process in a plurality of different process chambers, the optimal rate selected to reduce the defects in the wafers during the vacuum process, the controller configured to adjust the first control valve responsive to the first pressure sensor and to adjust the second control valve responsive to the second pressure sensor to achieve the optimal rate in the first process chamber and in the second process chamber.

20. The vacuum system of claim 19 wherein the first process chamber and the second process chamber are on a same frame.

21. The vacuum system of claim 19 wherein the first process chamber and the second process chamber are on separate pieces of equipment.

22. The vacuum system of claim 19 wherein the vacuum process comprises a vacuum deposition process.

23. The vacuum system of claim 19 wherein the vacuum process comprises a vacuum etching process.

* * * * *